United States Patent
Matsuno et al.

(10) Patent No.: US 8,994,088 B2
(45) Date of Patent: Mar. 31, 2015

(54) SEMICONDUCTOR STORAGE DEVICE AND MANUFACTURING METHOD THEREOF

(71) Applicant: Kabushiki Kaisha Toshiba, Minato-ku (JP)

(72) Inventors: Koichi Matsuno, Mie-gun (JP); Yoshihiro Yanai, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/019,722

(22) Filed: Sep. 6, 2013

(65) Prior Publication Data
US 2014/0070296 A1 Mar. 13, 2014

(30) Foreign Application Priority Data
Sep. 10, 2012 (JP) .................................. 2012-198785

(51) Int. Cl.
*H01L 27/105* (2006.01)
*H01L 27/115* (2006.01)
*H01L 29/788* (2006.01)

(52) U.S. Cl.
CPC ...... *H01L 27/1052* (2013.01); *H01L 27/11524* (2013.01); *H01L 29/7881* (2013.01)
USPC ........................................................ 257/314

(58) Field of Classification Search
CPC .................... H01L 27/1052; H01L 27/11524
USPC .................................................. 257/314–326
See application file for complete search history.

(56) References Cited

U.S. PATENT DOCUMENTS

| | | | |
|---|---|---|---|
| 6,716,761 B2 | 4/2004 | Mitsuiki | |
| 7,604,926 B2 | 10/2009 | Kamigaki et al. | |
| 7,713,833 B2 | 5/2010 | Mashita et al. | |
| 8,158,333 B2 | 4/2012 | Hashimoto | |
| 8,329,385 B2 | 12/2012 | Shiobara et al. | |
| 2002/0094688 A1 | 7/2002 | Mitsuiki | |
| 2007/0238053 A1 | 10/2007 | Hashimoto | |
| 2008/0013377 A1* | 1/2008 | Sel et al. | 365/185.17 |
| 2008/0055978 A1* | 3/2008 | Ishibashi et al. | 365/185.2 |
| 2009/0246954 A1 | 10/2009 | Miyoshi et al. | |

(Continued)

FOREIGN PATENT DOCUMENTS

| | | |
|---|---|---|
| JP | 2002-217170 A | 8/2002 |
| JP | 2007-305970 A | 11/2007 |

(Continued)

OTHER PUBLICATIONS

Office Action mailed Dec. 17, 2014 in Japanese Application No. 20121198785 filed Sep. 10, 2012 (w/English translation).

*Primary Examiner* — Daniel Shook
(74) *Attorney, Agent, or Firm* — Oblon, McClelland, Maier & Neustadt, L.L.P.

(57) ABSTRACT

A semiconductor storage device according to the present embodiment includes a semiconductor substrate. A memory cell array includes a plurality of memory cells provided on the semiconductor substrate in an array direction. A selection gate transistor is provided on an end of the memory cell array, and is used to select the memory cells from the memory cell arrays. A dummy cell is provided between a gate electrode of one of the memory cells on the end of the memory cell array and a gate electrode of the selection gate transistor. The width of a gate electrode of the dummy cell in the array direction of the memory cells and the dummy cell is twice or more as large as the width of the gate electrode of one of the memory cells.

9 Claims, 7 Drawing Sheets

(56) References Cited

U.S. PATENT DOCUMENTS

| | | |
|---|---|---|
| 2009/0302000 A1 | 12/2009 | Ito |
| 2009/0305166 A1 | 12/2009 | Shiobara et al. |
| 2010/0081265 A1 | 4/2010 | Mashita et al. |
| 2010/0221665 A1 | 9/2010 | Hashimoto |
| 2012/0156866 A1* | 6/2012 | Ahn .............................. 438/585 |
| 2013/0157437 A1* | 6/2013 | Yanai et al. ................... 438/424 |

FOREIGN PATENT DOCUMENTS

| | | |
|---|---|---|
| JP | 2009-239030 A | 10/2009 |
| JP | 2009-295790 A | 12/2009 |
| JP | 2009-302143 A | 12/2009 |
| JP | 2010-87301 A | 4/2010 |
| JP | 2010-245173 A | 10/2010 |
| JP | 2013-128059 A | 6/2013 |

* cited by examiner

# SEMICONDUCTOR STORAGE DEVICE AND MANUFACTURING METHOD THEREOF

CROSS REFERENCE TO RELATED APPLICATIONS

This application is based upon and claims the benefit of priority from the prior Japanese Patent Application No. 2012-198785, filed on Sep. 10, 2012, the entire contents of which are incorporated herein by reference.

FIELD

The embodiments of the present invention relate to a semiconductor storage device and manufacturing method thereof.

BACKGROUND

In a semiconductor storage device such as a NAND flash EEPROM, selection gate transistors are conventionally provided on both ends of a memory cell array, respectively so as to select memory cells (a NAND string). While a hard mask for each gate electrode of a memory cell is processed by a sidewall transfer method for using a sidewall as a mask, a hard mask for each gate electrode of a selection gate transistor is processed by a lithographic technique. With the lithographic technique, the resolution for an aperiodic pattern such as a gate electrode pattern of the selection gate transistors is inferior to that for a periodic pattern such as a gate electrode pattern of the memory cell array. Therefore, it is necessary to design a semiconductor storage device so as to make a space width on a boundary between each selection gate transistor and a memory cell array larger than an interval between the adjacent memory cells.

However, if the space width between each selection gate transistor and a memory cell array is large, the following phenomenon occurs. At the time of processing gate electrodes of the selection gate transistors and those of the memory cells by RIE (Reactive Ion Etching), the phenomenon (substrate gouging) occurs that a semiconductor substrate is gouged out in a space region between each of the selection gate transistors and the memory cell array.

Such substrate gouging may cause a rise in a resistance of a diffusion layer and a reduction in a cell current in the space region between each selection gate transistor and the memory cell array.

DETAILED DESCRIPTION

A semiconductor storage device according to the present embodiment includes a semiconductor substrate. A memory cell array includes a plurality of memory cells provided on the semiconductor substrate in an array direction. A selection gate transistor is provided on an end of the memory cell array, and is used to select the memory cells from the memory cell arrays. A dummy cell is provided between a gate electrode of one of the memory cells on the end of the memory cell array and a gate electrode of the selection gate transistor. The width of a gate electrode of the dummy cell in the array direction of the memory cells and the dummy cell is twice or more as large as the width of the gate electrode of one of the memory cells.

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction.

Figure 1:
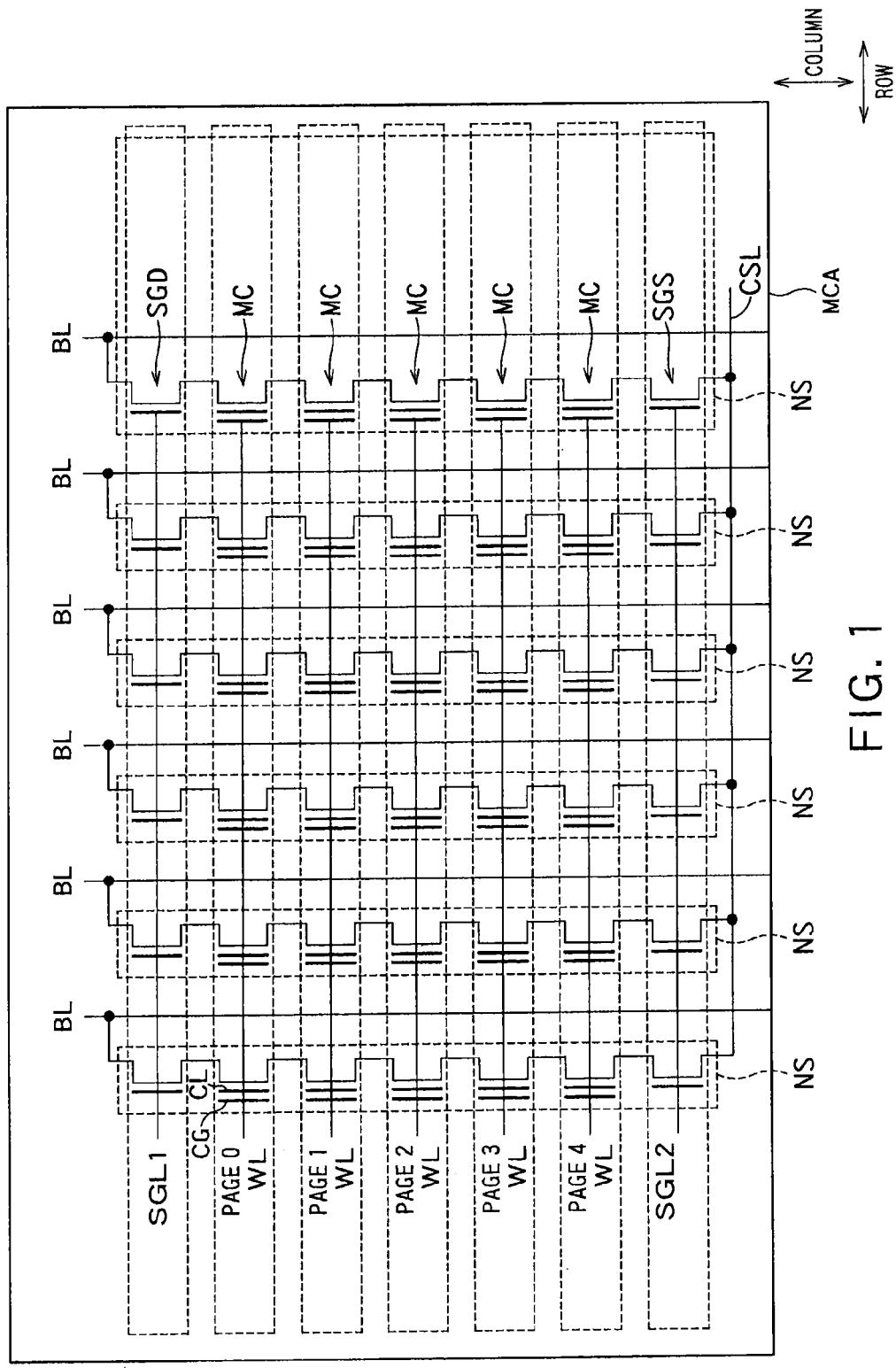
FIG. 1 is a configuration diagram of an example of a memory cell array MCA in a NAND flash EEPROM according to the present embodiment.

FIG. 1 is a configuration diagram of an example of a memory cell array MCA in a NAND flash EEPROM according to the present embodiment. The memory cell array MCA includes a plurality of NAND strings NS connected to bit lines BL in respective columns. Each NAND string NS includes a plurality of memory cells MC connected in series and selection gate transistors SGS and SGD connected to both ends of these series-connected memory cells MC, respectively. While five memory cells MC are connected in series in each NAND string NS in an example shown in FIG. 1, 32 or 64 memory cells MC are generally connected in series per NAND string. One end of each NAND string NS is connected to a corresponding bit line BL and the other end thereof is connected to a common source line CSL. Note that FIG. 1 shows a memory cell block that is a data erasure unit as the memory cell array MCA. Generally, the memory cell array MCA includes a plurality of memory cell blocks as shown in FIG. 1.

A control gate CG of each memory cell MC is connected to a word line WL on a page to which the memory cell MC belongs. A gate of each of the selection gate transistors SGD or SGS is connected to a selection gate line SGL1 or SGL2. A page is a data read unit or data write unit.

A plurality of word lines WL extend in a row direction and a plurality of bit lines BL extend in a column direction so as to be substantially orthogonal to the row direction.

As shown in FIG. 1, the memory cells MC are provided to correspond to grid intersections constituted by the word lines WL and active areas AA provided in parallel to the bit lines BL, as described later. While the memory cell array MCA (the memory cell block) according to the present embodiment includes 5×6(=30) memory cells MC, the number of memory cells MC within one memory cell block is not limited to 30.

An n-FET (Field-Effect Transistor) including a charge accumulation layer CL and the control gate CG can be used as each of the memory cells MC. By applying a voltage to the control gate CG from each word line WL, electric charges (e.g. electrons) are charged into the charge accumulation layer CL or discharged from the charge accumulation layer CL. Data is thereby written to or erased from each memory cell MC. The memory cell MC has a threshold voltage according to the number of electric charges (e.g. electrons) accumulated in the charge accumulation layer CL. The memory cell MC can electrically store binary data (one bit) or multilevel data (two or more bits) depending on the threshold voltage. In this way, it suffices that a charge-accumulation-type nonvolatile memory is used as the memory cell MC.

Figure 2:
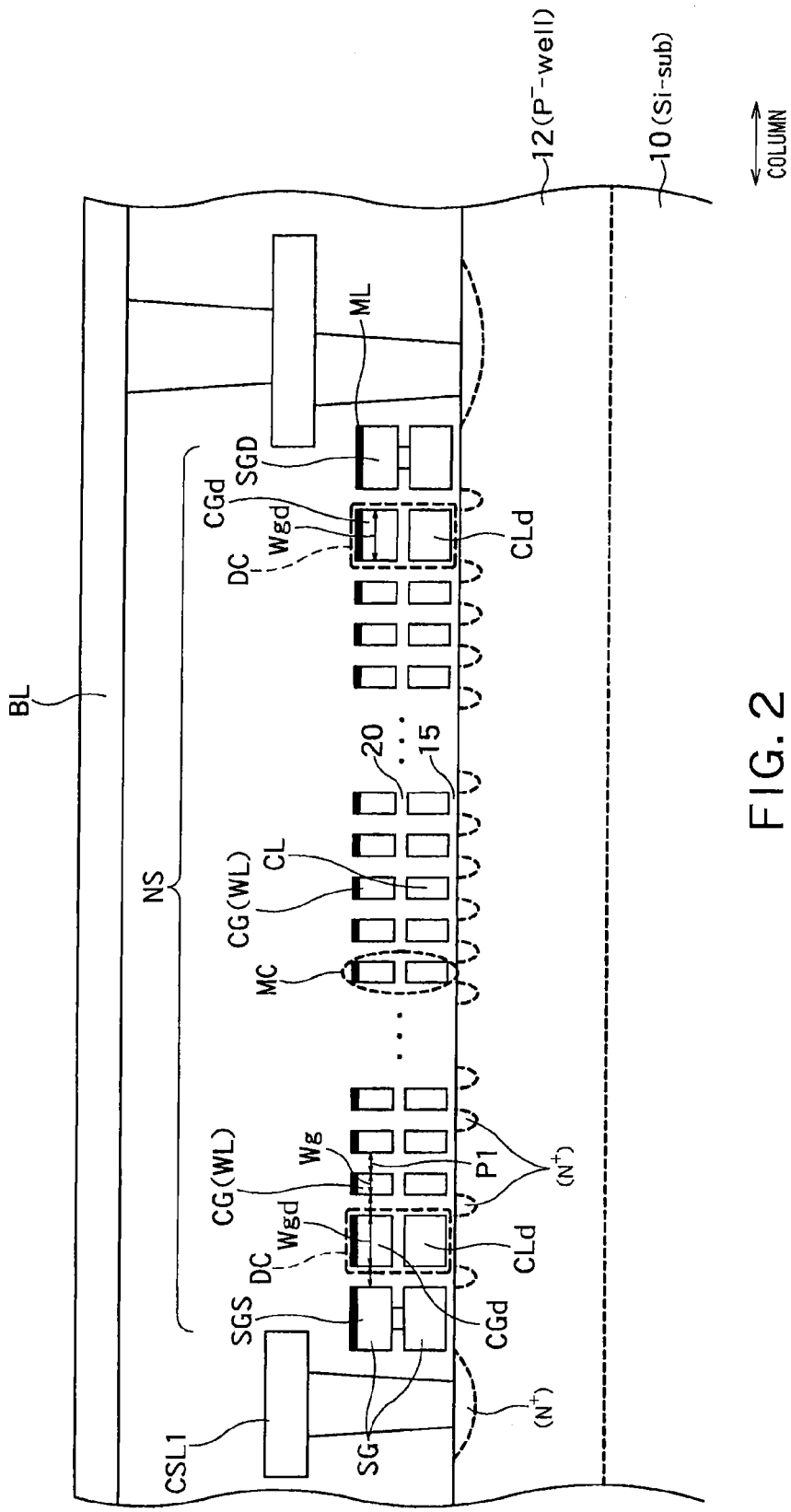
FIG. 2 is a cross-sectional view showing an example of a NAND string NS part. Each NAND string NS is formed on a P-well 12 formed on a silicon substrate 10.

FIG. 2 is a cross-sectional view showing an example of a NAND string NS part. Each NAND string NS is formed on a P-well 12 formed on a silicon substrate 10. The common source line CSL is connected to the selection gate transistor SGS on a source side connected to a source side of the NAND string NS. The bit line BL is connected to the selection gate transistor SGD on a drain side connected to a drain side of the NAND string NS.

Two memory cells MC adjacent in the column direction share an n⁺ diffusion layer, whereby a plurality of memory cells MC are connected in series between the selection gate transistors SGD and SGS.

Each memory cell MC includes the charge accumulation layer CL provided on the silicon substrate 10 via a tunnel gate dielectric film 15 and includes the control gate CG provided on the charge accumulation layer CL via an IPD (Inter Layer Dielectric) film 20. The control gate CG is also referred to as "word line WL" because the control gate CG is connected to one word line WL or functions as the word line WL.

Gate electrodes of the selection gate transistors SGD and SGS are made of the same material as that of the charge accumulation layer CL and the control gate CG of each memory cell MC. However, a part of the IPD film 20 between the charge accumulation layer CL and the control gate CG is eliminated to allow the charge accumulation layer CL and the control gate CG to be electrically connected to each other.

The selection gate transistor SGD or SGS is provided on one end of the memory cell array MCA and one end of each NAND string NS. And, the selection gate transistor SGD or SGS is provided to selectively connect the NAND string NS and the memory cells MC among those in the memory cell array MCA to the bit line BL or the common source line CSL shown in FIG. 1.

The charge accumulation layer CL, which is voltage-controlled by the word line WL, can accumulate electric charges (electrons, for example) injected via the tunnel gate dielectric film 15. Conversely, the charge accumulation layer CL can discharge electric charges (electrons, for example) via the tunnel gate dielectric film 15.

A dummy cell DC is provided between the selection gate transistor SGD or SGS and the memory cells MC. The dummy cell DC operates similarly to unselected memory cells MC but does not store effective data. Therefore, during data write and data read operations, the dummy cells DC are in conductive states but are not selected for effective data writing or data reading. For this reason, the dummy cells DC are not shown in a circuit diagram of FIG. 1.

A metal layer ML is provided on the control gates CG of the memory cells MC, control gates CGd of the dummy cells DC, and gate electrodes SG of the selection gate transistors SGD and SGS. The metal layer ML is formed by using, for example, low resistance metal such as tungsten. The metal layer ML reduces gate resistances of the memory cells MC, the dummy cells DC, and the selection gate transistors SGD and SGS. Although the memory cells MC are downscaled, it is possible to suppress a resistance of each word line WL to be low by providing the metal layer ML.

A width Wgd of each of a control gate CGd and a charge accumulation layer CLd (hereinafter, also simply "gate electrodes CGd and CLd") of each dummy cell DC in an array direction (column direction) of the memory cells MC and the dummy cells DC is twice or more as large as a width Wg of each of the control gate CG and the charge accumulation layer CL (hereinafter, also simply "gate electrodes CG and CL") of each general memory cell MC. Furthermore, the gate electrodes CG and CL of the memory cells MC are arranged at intervals of a first pitch P1 in the column direction. An interval between the gate electrode CGd or CLd of each dummy cell DC and a gate electrode SG of the selection gate transistor SGD (or SGS) is almost equal to the first pitch P1 in the column direction. Furthermore, an interval between the gate electrode CG or CL of the memory cell MC on an end of the memory cell array MCA and the gate electrode CGd or CLd of the dummy cell DC is almost equal to the first pitch P1. In this way, the selection gate transistors SGD and SGS, the dummy cells DC, and the memory cells MC are arranged at the same pitch P1 in the column direction despite a difference in the width of each gate electrode in the column direction.

In recent years, in a manufacturing process of a semiconductor device, a sidewall transfer method is used to form a pattern at a size equal to or smaller than a minimum feature size F by a lithographic technique. With the sidewall transfer method, it is possible to form a pattern at a half pitch or smaller than the minimum feature size F by the lithographic technique.

However, in the generation in which the half pitch of the minimum feature size F is equal to or smaller than about 20 nm, a lithographic resolution often degrades and pattern defects occasionally occur in boundary portions where a layout pattern changes. For example, in the memory cell array MCA, the gate electrodes WL and CL of the equal-width memory cells MC are arrayed periodically at the same pitch. However, because of the difference in a width between the gate electrodes SG of the selection gate transistors SGD, SGS and the gate electrodes CG, CL of the memory cells MC, the layout pattern changes on ends of the memory cell arrays MCA. In such regions where the layout pattern changes, when the gate electrodes SG of the selection gate transistors SGD, SGS and the gate electrodes CG, CL of the memory cells MC are arrayed at the same pitch, pattern defects occur. Therefore, in the generation in which the half pitch of the minimum feature size F is equal to or smaller than 20 nm to follow downscaling, it is preferable to make the interval between each selection gate transistor SGD or SGS and each memory cell MC larger than the pitch of the memory cells MC.

On the other hand, when the interval between each selection gate transistor SGD or SGS and each memory cell MC is large, substrate gouging tends to occur on a surface of the semiconductor substrate 10 between the selection gate transistor SGD or SGS and the memory cells MC as explained above.

As described later, in the present embodiment, an interval, that is, a space S0 between the selection gate transistor SGD or SGS and one of the memory cells MC is made larger than the first pitch P1 between the adjacent memory cells MC, thereby the pattern defects are suppressed in a lithographic process at the time of processing gate electrodes. Furthermore, space between the selection gate transistor SGD or SGS and the memory cells is reduced, for example, to provide the dummy cell DC between the selection gate transistor SGD or SGS and the memory cells MC, thereby substrate gouging is suppressed in etching processes at the time of processing the gate electrodes.

Furthermore, the width Wgd of each of the gate electrodes WLd and CLd of the dummy cells DC is twice or more as large as the width Wg of each of the gate electrodes WL and CL of the memory cells MC in the column direction. It is thereby possible to reinforce sidewall masks present on the ends of the memory cell array MCA among the sidewall masks used in the sidewall transfer method at the time of processing the gate electrodes and to suppress the sidewall masks from collapsing as described later.

FIGS. 3A to 7B are cross-sectional views showing an example of a manufacturing method of the NAND flash EEPROM according to the present embodiment. The cross-sectional views of FIGS. 3A to 7B are those in the column direction along one active area AA and one bit line BL.

Furthermore, the cross-sectional views of FIGS. 3A to 7B show the memory cells MC, the dummy cells DC, and the selection gate transistor SGD (or SGS) from left to right in each drawing.

First, the tunnel gate dielectric film 15 is formed on the silicon substrate 10. For example, a silicon oxide film is used for the tunnel gate dielectric film 15 and the silicon oxide film is formed by oxidizing the silicon substrate 10. The material of the charge accumulation layer CL is deposited on the tunnel gate dielectric film 15. The material of the charge accumulation layer CL is formed by using, for example, polysilicon or a laminated film of polysilicon and a silicon nitride film. Next, to separate the active area AA, element isolating regions (STI: Shallow Trench Isolation) are formed, although not shown in the drawing. The IPD film 20 is deposited on the charge accumulation layer CL, and a part of the IPD film 20 provided for the selection gate transistor SGD or SGS is removed. For example, the IPD film 20 is an insulating film such as a silicon oxide film, a silicon nitride film, or a High-k film. The material of the control gate CG is deposited on the IPD film 20. For example, the material of the control gate CG is a conductive film made of doped polysilicon. The metal layer ML is formed on the control gate CG. The metal layer ML is formed by using, for example, low resistance metal such as tungsten. In this way, the materials of the charge accumulation layer CL, the control gate CG, and the metal layer ML are deposited above the silicon substrate 10 as gate electrode materials.

As for the selection gate transistor SGS or SGD, the material of the control gate CG is deposited on the material of the charge accumulation layer CL. And, the control gate CG is electrically connected to the charge accumulation layer CL in a portion from which the IPD 20 is removed.

The material of a hard mask 30 is deposited on the material layer ML. The material of the hard mask 30 is formed by using, for example, an insulating film such as a silicon oxide film or a silicon nitride film. The material of a mandrel 40 for forming sidewall masks is deposited on the hard mask 30. Any material can be used as the material of the mandrel 40 as long as the material can selectively etch the hard mask 30. Accordingly, the material of the mandrel 40 is formed by using, for example, a silicon oxide film, a silicon nitride film, or amorphous silicon.

Figure 3A:
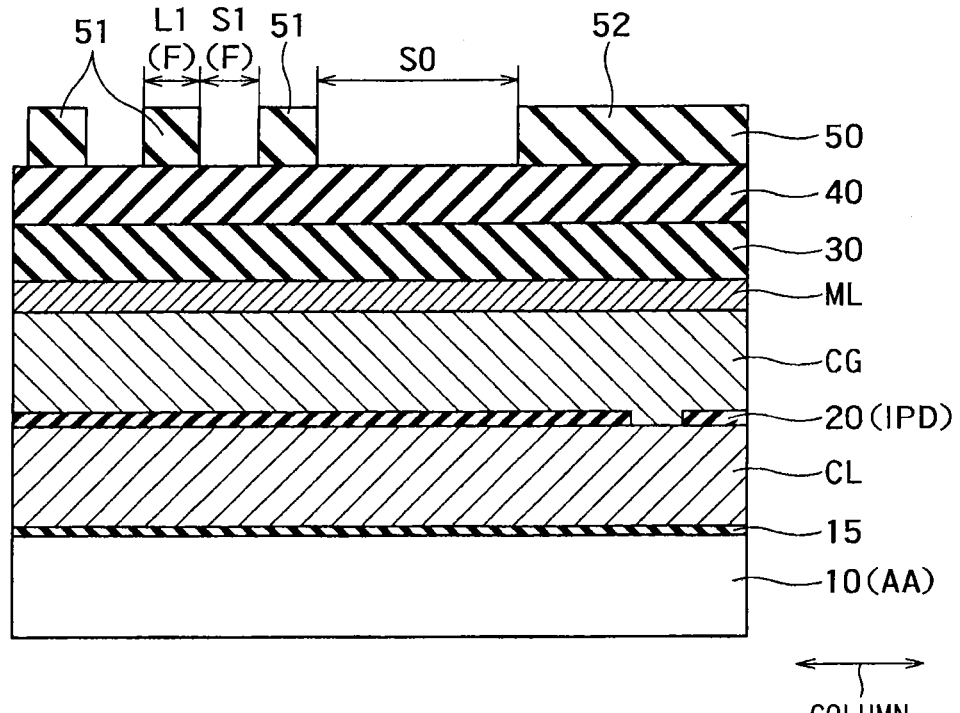
FIGS. 3A to 7B are cross-sectional views showing an example of a manufacturing method of the NAND flash EEPROM according to the present embodiment.

Furthermore, a resist mask 50 is formed on the material of the mandrel 40 by using a lithographic technique. A structure shown in FIG. 3A is thereby obtained. At this time, each resist mask 51 in a region of the memory cells MC and the dummy cells DC is formed so that a line L1 has a width equal to the minimum feature size F (equal to or smaller than about 40 nm). A space S1 between the resist masks 51 is also formed to have a width equal to the minimum feature size F (equal to or smaller than about 40 nm). A width of the space S0 between a resist mask 52 in a region of the selection gate transistor SGD or SGS and the resist mask 51 is larger than a width F of the space S1 between the resist masks 51. The width of the space S0 is, for example, 2F. Therefore, although a pattern of the resist masks 51 and a pattern of the resist mask 52 are uneven and aperiodic, pattern defects do not occur on boundaries of the patterns.

Figure 3B:
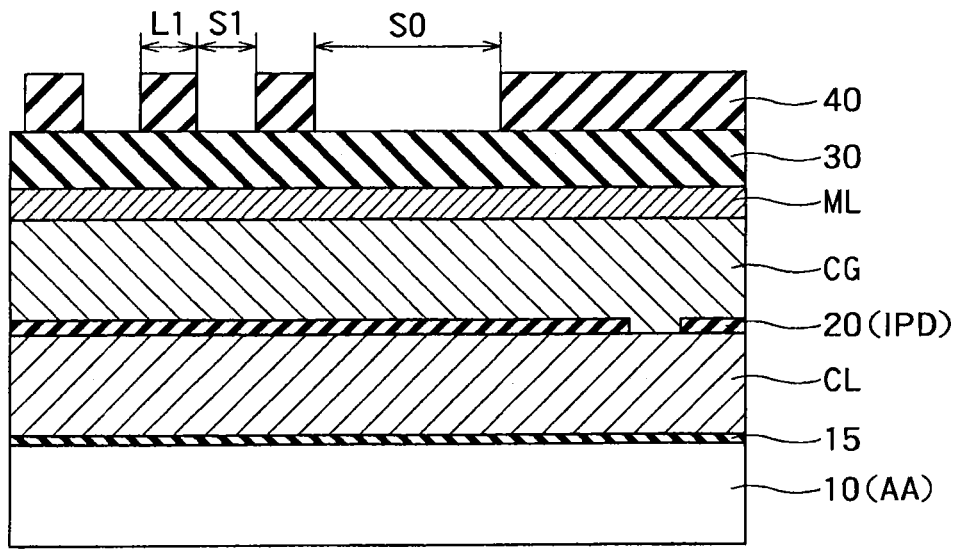

As shown in FIG. 3B, the mandrel 40 is processed by RIE (Reactive Ion Etching) or the like with the resist mask 50 used as a mask. By doing so, patterns of the resist mask 50 are transferred onto the mandrel 40.

Figure 4A:
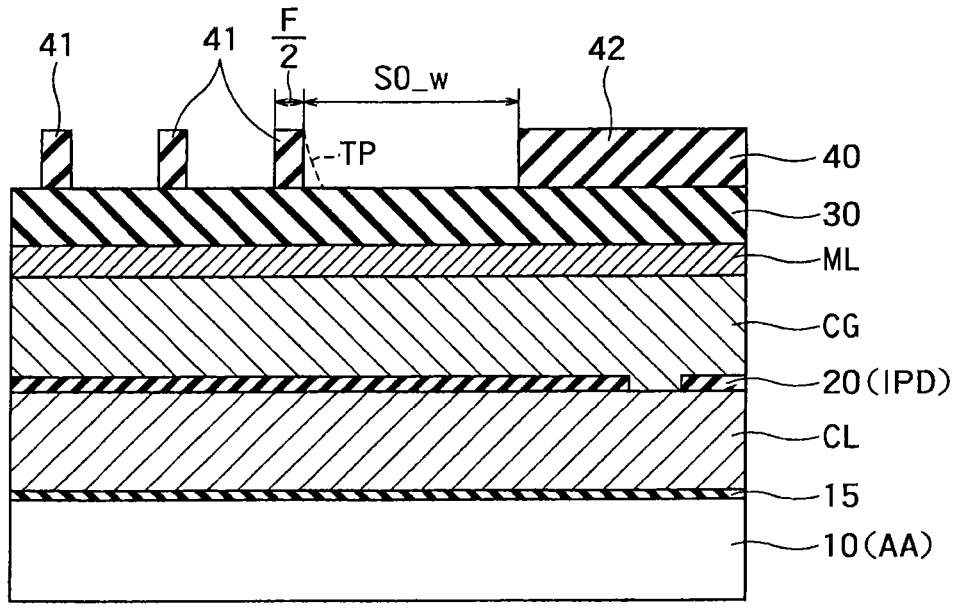

As shown in FIG. 4A, the mandrel 40 is etched (slimmed) from a side surface direction so as to adjust a width of the mandrel 40 in the column direction. By slimming mandrels 42, a width of each mandrel 41 in the region of the memory cells MC and the dummy cells DC is made about (1/2)F (half pitch). A mandrel 42 in the region of the selection gate transistor SGD or SGS is also slimmed. A space between the mandrels 41 and 42 is made S0_w slightly larger than the S0.

Figure 4B:
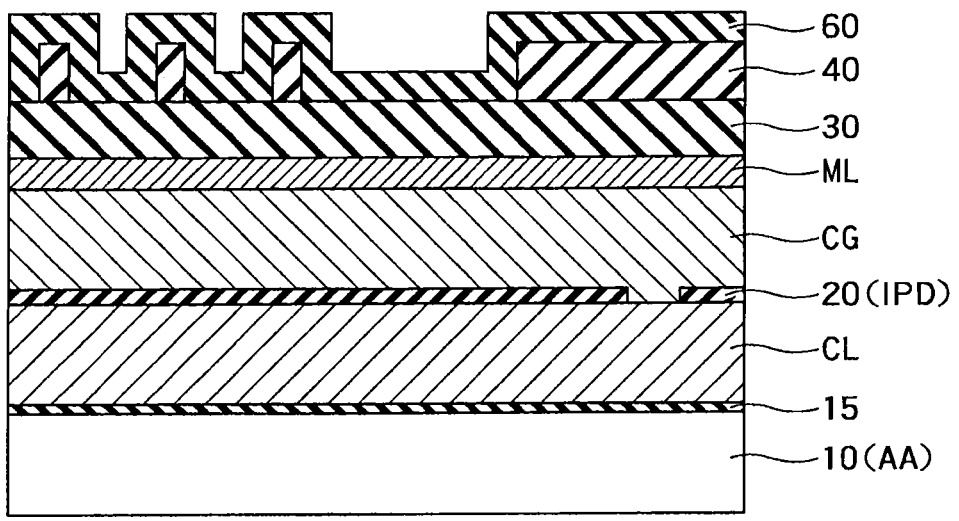

As shown in FIG. 4B, the material of a sidewall mask 60 is deposited on the mandrel 40 and the hard mask 30. The material of the sidewall mask 60 is one that can selectively etch the mandrel 40 and the hard mask 30. For example, the material of the sidewall mask 60 can be formed by using a silicon oxide film, a silicon nitride film or polysilicon. A thickness of the material of the sidewall mask 60 is about (1/2)F. In an actual manufacturing process, it suffices that the thickness of the material of the sidewall mask 60 is made slightly larger than (1/2)F, because the sidewall mask 60 is also etched in the side surface direction of the mandrel 40 to some extent in a process of etching the material of the sidewall mask 60.

Figure 5A:
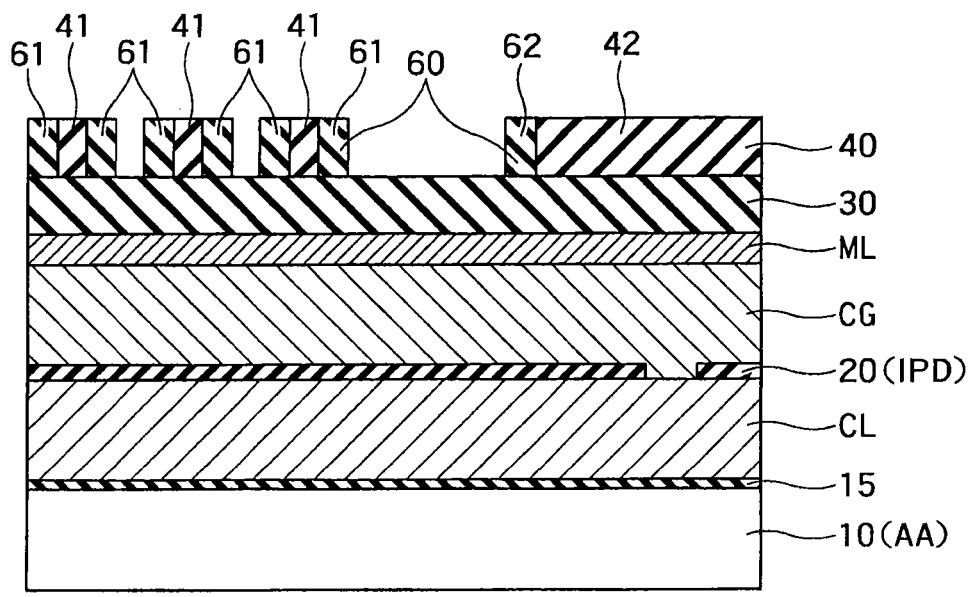

As shown in FIG. 5A, the material of the sidewall mask 60 is left on side surfaces of the mandrel 40 by anisotropically etching back the material of the sidewall mask 60 by a RIE method. The sidewall mask 60 is thereby formed. More specifically, on the material of the hard mask 30, first sidewall masks 61 are formed into a layout pattern (hereinafter, also "array pattern") of the gate electrodes CG and CL of the memory cells MC. On the material of the hard mask 30, a second sidewall mask 62 is formed into a part of a layout pattern of the gate electrode SG of the selection gate transistor SGD or SGS.

Figure 5B:
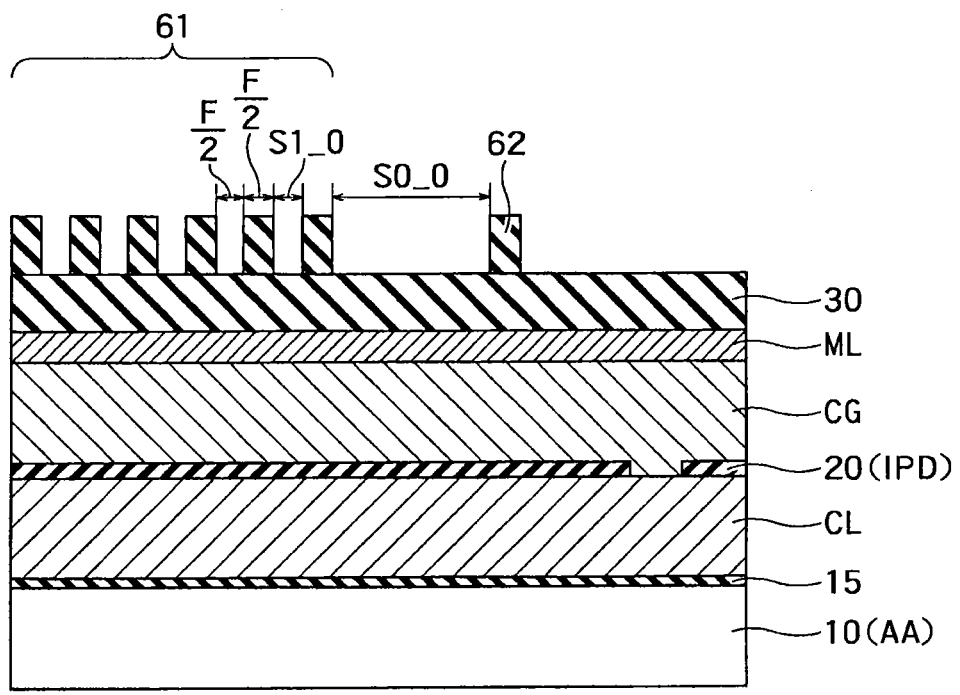

Next, the mandrels 41 are removed by using wet etching. The sidewall mask 60 is thereby left on the material of the hard mask 30 as shown in FIG. 5B. Note that a width of a space S1_0 between the adjacent first sidewall masks 61 is (1/2)F (that is, half pitch). A width of a space S0_0 between the first sidewall mask 61 on an end of the array pattern and the second sidewall mask 62 is about (3/2)F smaller than the space S0 shown in FIG. 3A.

Figure 6A:
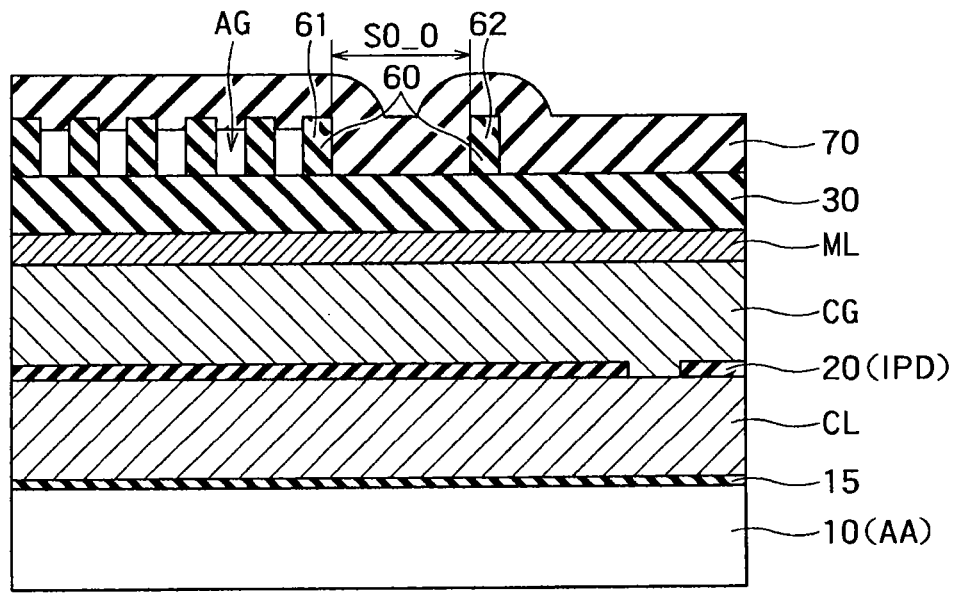

As shown in FIG. 6A, the material of a spacer 70 is deposited so as to bury the space S0_0 between the first sidewall mask 61 on an end of the array pattern and the second sidewall mask 62 without burying the spaces S1_0 between the adjacent first sidewall masks 61. For example, the material of the spacer 70 can be a silicon oxide film deposited by using monosilane ($SiH_4$) by a plasma CVD (Chemical Vapor Deposition) method. At this time, if the material is formed by a plasma CVD method under conditions of poor material embeddability (poor coverage), the formed material is unable to enter small gaps. Using properties of such plasma CVD, the material of the spacer 70 is deposited so as to bury the space S0_0 while forming air gaps AG between the adjacent first sidewall masks 61. Any material can be used as the material of the spacer 70 as long as the material can selectively etch the hard mask 30. For example, a silicon nitride film or polysilicon besides the silicon oxide film can be used as the material of the spacer 70. Furthermore, a film thickness of the material of the spacer 70 is about ⅓ of that of the space S0_0. When the width of the space S0_0 is (3/2)F, the film thickness of the material of the spacer 70 is a half pitch. Needless to say, the film thickness of the material of the spacer 70 can be adjusted so as to control the width of the space S0_1 or the width of the gate electrodes CGd and CLd of the dummy cells DC. Moreover, similarly to the material of the sidewall mask 60, the material of the spacer 70 can be deposited by a thickness larger than a desired film thickness in view of side etching as described later.

Figure 6B:
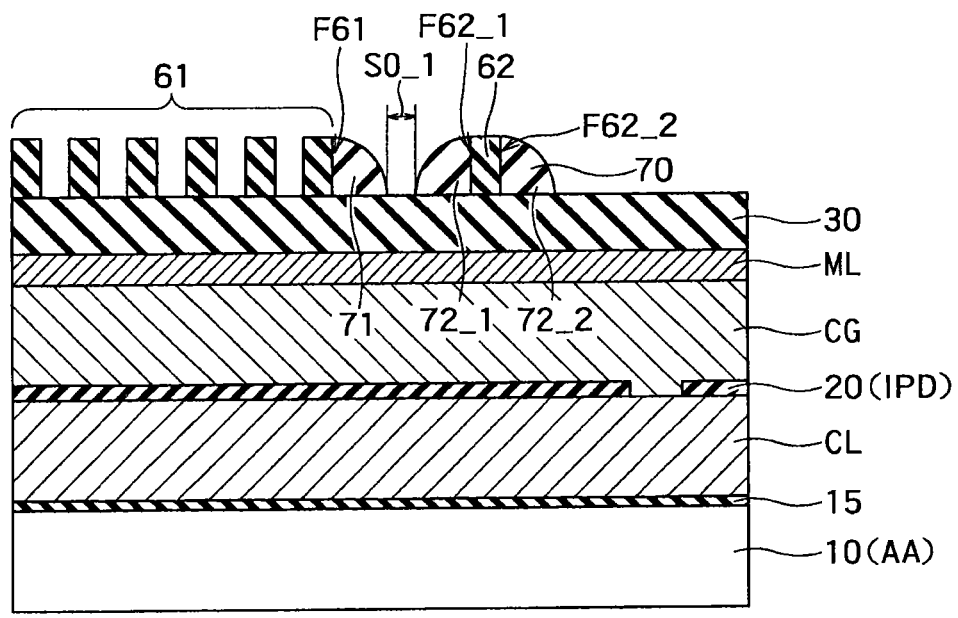

As shown in FIG. 6B, the material of the spacers 70 is anisotropically etched back by, for example, a RIE method. The material of the spacers 70 is left on opposed surfaces F61 and F62_1 of the first and second sidewall masks 61 and 62 faced to each other between the first sidewall mask 61 and the second sidewall mask 62 at an end of the array pattern. And, the material of the spacers 70 is left on a side surface F62_2 opposite to the opposed side surface F62_1 of the second sidewall mask 62. The spacers 70 are thereby formed. The material of the spacers 70 formed on the first sidewall masks 61 in the array pattern is removed by this etching process.

By forming the spacers 70 on the opposed side surfaces F61 and F62_1, the width of the space between the first sidewall mask 61 on the end of the array pattern and the second sidewall mask 62 is reduced to about ⅓ of the width of the original space S0_0. The reduced space S0_0 is referred to as "space S0_1" for convenience. The width of the space S0_1 can be changed depending on the film thickness of the material of the spacers 70. If the material of the spacers 70 is made thicker, the space S0_1 becomes narrower. Conversely, if the material of the spacer 70 is made thinner, the space S0_1 becomes wider.

The width of the space S0_1 can be also changed depending on positions of the mandrel 42 and the second sidewall mask 62 shown in FIGS. 5A and 5B. For example, if the width of the space S0_0 shown in FIG. 5B is set to (3/2)F (three times as large as the half pitch) and the film thickness of the material of the spacer 70 is set to a half pitch, the width of the space S0_1 is almost equal to (½)F (half pitch). That is, the space S0_1 can be made almost equal to the interval between the adjacent first sidewall masks 61 in the array pattern.

Hereinafter, the spacer 70 left on the side surface F61 of the first sidewall mask 61 is referred to as "spacer 71", the spacer 70 left on the side surface F62_1 of the second sidewall mask 62 is referred to as "spacer 72_1", and the spacer 70 formed on the side surface F62_2 of the second sidewall mask 62 is referred to as "spacer 72_2".

The first sidewall mask 61 and the spacer 71 on the end of the array pattern are used as a mask at the time of forming the gate electrodes CGd and CLd of the dummy cells DC. The spacers 72_1 and 72_2 and the second sidewall mask 62, as well as a resist film 80 described later, are used as a mask at the time of forming the gate electrode SG of the selection gate transistor SGD or SGS.

Figure 7A:
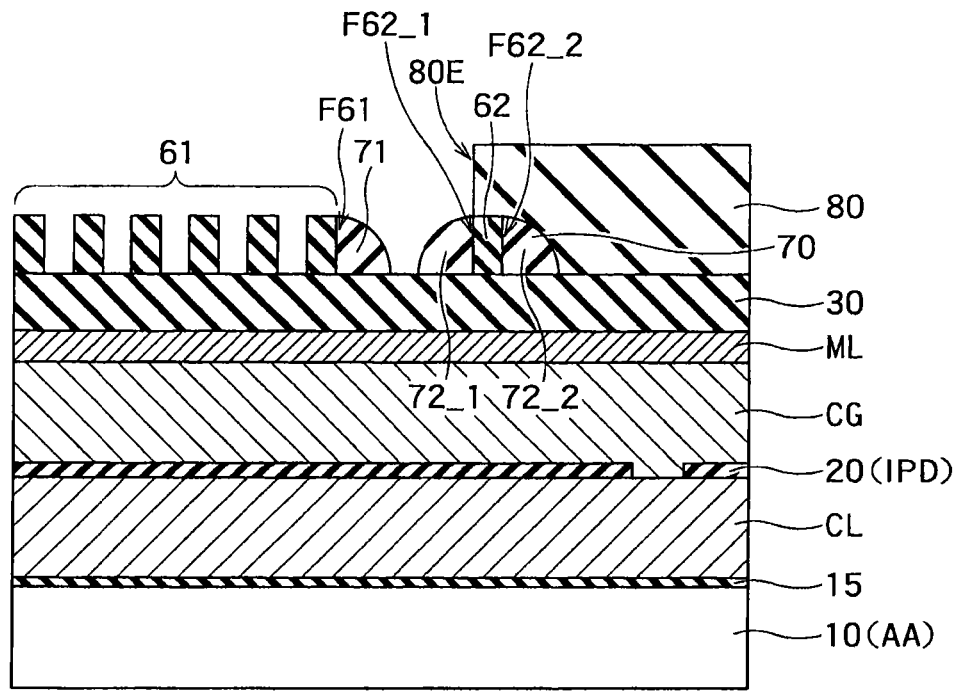

As shown in FIG. 7A, the resist film 80 that covers upper portions of the gate electrode SG (see FIG. 2) of the selection gate transistors SGD and SGS is formed by a lithographic technique. At this time, it suffices that one end 80E of the resist film 80 is present on any one of the spacers 72_1 and 72_2 and the second sidewall mask 62. The gate electrodes SG of selection gate transistors SGD, SGS thereby extend to an end of the spacer 72_1. When the gate electrodes SG extend as well as the dummy cells DC are formed, the widths of the spaces S0 and S0_0 are reduced to the width of the space S0_1. This can suppress substrate gouging at the time of processing the gate electrode materials ML, CG, and CL. Furthermore, an alignment margin is wide in lithography because it suffices that one end 80E of the resist film 80 is present on any one of the spacers 72_1 and 72_2 and the second sidewall mask 62 in the present embodiment.

Next, the material of the hard mask 30 is processed by a RIE method by using at least the first sidewall masks 61, the spacers 71 and 72_1, and the resist film 80 as a mask. At this time, when the second sidewall mask 62 is not completely covered with the resist film 80, the second sidewall mask 62 is also used as the mask. Moreover, when the spacer 72_2 is not completely covered with the resist film 80, the spacer 72_2 is also used as the mask.

Figure 7B:
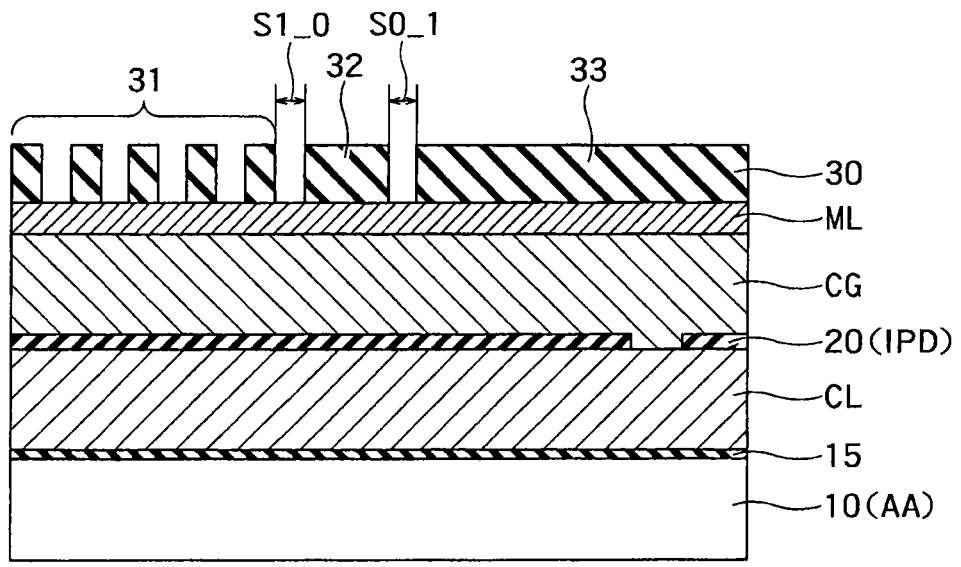

In the array pattern of the memory cells MC, patterns of the first sidewall masks 61 are transferred onto the hard mask 30. Hard masks 31 are thereby formed on the gate electrode materials ML, CG, and CL as shown in FIG. 7B. Note that the first sidewall mask 61 on each end of the array pattern is used to form patterns of the dummy cells DC.

In a region of the dummy cells DC, the first sidewall mask 61 and the spacer 71 on each end of the array pattern are transferred onto the hard mask 30. A hard mask 32 is thereby formed on the gate electrode materials ML, CG, and CL.

In a region of the selection gate transistors SGD or SGS, the resist film 80, the second sidewall mask 62, or the spacers 72_1 and 72_2 are transferred onto the hard mask 30. A hard mask 33 is thereby formed on the gate electrode materials ML, CG, and CL.

At this time, in the array pattern of a region of the memory cells MC, an interval between the adjacent hard masks 31 is almost equal to the space S1_0 (half pitch). An interval between the hard mask 31 on each end of the array pattern and the hard mask 32 corresponding to the dummy cells DC is also almost equal to the space S1_0 (half pitch). Furthermore, the width of the space S0_1 between the hard mask 32 and the hard mask 33 corresponding to the selection gate transistors SGD or SGS can be set almost equal to the space S1_0 (half pitch). That is, all the intervals of the hard masks 31 to 33 adjacent in the column direction can be made equal to the space S1_0 (half pitch). Accordingly, it is possible to suppress substrate gouging and to uniformly etch the gate electrode materials ML, CG, and CL at the time of etching the gate electrode materials ML, CG, and CL.

Next, the gate electrode materials ML, CG, and CL are processed by using the hard masks 31 to 33 as a mask. Then, impurities are implanted into the active areas AA by using the gate electrode materials ML, CG, and CL as a mask in order to form source layers and drain layers. Thereafter, an interlayer dielectric film, contacts, metal wirings, and the like are formed in order to form a multilayer wiring structure. The NAND flash EEPROM as shown in FIG. 2 is thereby completed.

In this way, according to the present embodiment, the gate electrodes CGd and CLd of the dummy cells DC are formed in a region from the space S1_0 to the space S0_1 between the memory cell array MCA and the selection gate transistors SGD or SGS. Furthermore, the gate electrodes SG of the selection gate transistors SGD or SGS extend to be closer to the space S0_1 rather than the end of the resist mask 52 in the lithography. Accordingly, it is possible to form both the spaces S1_0 and S0_1 to be narrow and to suppress substrate gouging at the time of processing the gate electrode materials ML, CG, and CL as shown in FIG. 7B.

Moreover, the intervals between the gate electrodes of the memory cells MC and the dummy cells DC, between the gate electrode of the selection gate transistors SGD or SGS and the dummy cells DC can all be made equal to the half pitch. This facilitates processing the gate electrode materials ML, CG, and CL.

As shown in FIG. 4A, the mandrel 41 on each end of the array pattern is occasionally processed to have a taper TP on a side surface of the mandrel 41 that faces the space S0_w. In this case, the first sidewall mask 61 on the end of the array pattern shown in FIG. 5B is inclined along the taper TP. Without the spacer 71, the first sidewall mask 61 on the end of the array pattern possibly collapses because the first sidewall mask 61 is inclined. In contrast, according to the present embodiment, the spacer 71 reinforces the first sidewall mask 61 on each end of the array pattern as shown in FIG. 6B. Therefore, even when the first sidewall mask 61 on the end of the array pattern is inclined, there is less probability of the collapse. The widths of the first sidewall mask 61 and the spacer 71 on each end of the array pattern are equal to or larger than F. By using the first sidewall mask 61 and the spacer 71 on the end of the array pattern as a mask, it is possible to form the gate electrodes CGd and CLd of the dummy cells DC each having the width Wgd twice or more as large as the width Wg of the gate electrodes WL and CL of the memory cells MC.

Furthermore, the first sidewall mask 61 on each end of the array pattern shown in FIG. 5B tends to be lower than the other first sidewall masks 61 due to process characteristics. In this case, the first sidewall mask 61 on the end of the array pattern is possibly eliminated during the process of the hard mask 30. However, according to the present embodiment, the spacer 71 is formed on the side surface F71 of the first sidewall mask 61 on the end of the array pattern. This can suppress the first sidewall mask 61 on the end of the array pattern from being eliminated while processing the hard mask 30.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a semiconductor substrate;
a memory cell array comprising a plurality of memory cells provided on the semiconductor substrate in an array direction;
a selection gate transistor provided on an end of the memory cell array, and used to select the memory cells from the memory cell arrays; and
a dummy cell provided between a gate electrode of one of the memory cells on the end of the memory cell array and a gate electrode of the selection gate transistor, wherein
a width of a gate electrode of the dummy cell in the array direction of the memory cells and the dummy cell is twice or more as large as a width of the gate electrode of one of the memory cells.

2. The device of claim 1, wherein
gate electrodes of the memory cells are arranged at a first pitch in the array direction, and
an interval between the gate electrode of the dummy cell and the gate electrode of the selection gate transistor in the array direction is almost equal to the first pitch.

3. The device of claim 2, wherein a half pitch of a minimum processing size by a lithographic technique in a manufacturing process of the semiconductor storage device is equal to or smaller than 20 nm.

4. The device of claim 3, wherein an interval between the gate electrode of one of the memory cells on an end of the memory cell array and the gate electrode of the dummy cell is almost equal to the first pitch.

5. The device of claim 4, wherein a tungsten layer is provided on upper portions of the gate electrodes of the memory cells, the gate electrode of the dummy cell, and the gate electrode of the selection gate transistor.

6. The device of claim 2, wherein
the memory cells arranged at the first pitch are connected in series to constitute a memory cell string, and
the selection gate transistor is provided on an end of the memory cell string, and selectively connects the memory cell string to a wiring.

7. The device of claim 1, wherein a half pitch of a minimum processing size by a lithographic technique in a manufacturing process of the semiconductor storage device is equal to or smaller than 20 nm.

8. The device of claim 2, wherein an interval between the gate electrode of one of the memory cells on an end of the memory cell array and the gate electrode of the dummy cell is almost equal to the first pitch.

9. The device of claim 1, wherein a tungsten layer is provided on upper portions of the gate electrodes of the memory cells, the gate electrode of the dummy cell, and the gate electrode of the selection gate transistor.

* * * * *